(12) United States Patent
Ismail et al.

(10) Patent No.: US 10,790,860 B2
(45) Date of Patent: Sep. 29, 2020

(54) DYNAMIC DETECTION FOR FLASH MEMORY

(71) Applicants: Kabushiki Kaisha Toshiba, Minato-ku (JP); Toshiba Memory Corporation, Minato-ku (JP)

(72) Inventors: Amr Ismail, Bristol (GB); Magnus Stig Torsten Sandell, Bristol (GB)

(73) Assignees: Kabushiki Kaisha Toshiba, Minato-ku (JP); Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/206,148

(22) Filed: Nov. 30, 2018

(65) Prior Publication Data
US 2020/0177209 A1 Jun. 4, 2020

(51) Int. Cl.
*H03M 13/39* (2006.01)
*H03M 13/11* (2006.01)
(Continued)

(52) U.S. Cl.
CPC ..... *H03M 13/3927* (2013.01); *G11C 11/4087* (2013.01); *G11C 11/5642* (2013.01);
(Continued)

(58) Field of Classification Search
CPC .................................................. H03M 13/3927
(Continued)

(56) References Cited

U.S. PATENT DOCUMENTS 8,429,501 B2  4/2013  Tseng et al.
8,549,385 B2  10/2013  Yang
(Continued)

OTHER PUBLICATIONS

G. Dong, N. Xie and T. Zhang, "On the Use of Soft-Decision Error-Correction Codes in Nand Flash Memory," in IEEE Transactions on Circuits and Systems I: Regular Papers, vol. 58, No. 2, pp. 429-439. Feb. 2011, DOI: 10.1109/TCSI.2010.2071990.
(Continued)

*Primary Examiner* — Fritz Alphonse
(74) *Attorney, Agent, or Firm* — Oblon, McClelland, Maier & Neustadt, L.L.P.

(57) ABSTRACT

A method of decoding data stored in non-volatile memory in which each memory cell stores data by adopting one of a plurality of storage states. The method comprises using a threshold for determining a physical property of the memory cells to distinguish between at least two storage states, reading a data codeword from a plurality of the memory cells using the threshold and determining a bit error rate for the data codeword read using the threshold, repeatedly modifying said threshold and re-reading said data codeword using said modified threshold and determining a modified bit error rate for the data codeword read using the modified threshold, selecting the one of the modified thresholds for which the mutual information content between the stored data input and the read data is maximised based on the bit error rate for the data codeword read using the threshold and the bit error rate for the data codeword read using the modified threshold, determining a log likelihood ratio of a quantisation interval bounded by the threshold and the selected threshold generating soft decoded data by performing soft decoding of the data using said log likelihood ratio and outputting the soft decoding data.

17 Claims, 5 Drawing Sheets

(51) Int. Cl.
*H03M 13/43* (2006.01)
*G11C 16/08* (2006.01)
*H03M 13/01* (2006.01)
*G11C 11/56* (2006.01)
*G11C 11/408* (2006.01)
*H03M 13/45* (2006.01)

(52) U.S. Cl.
CPC .......... *G11C 16/08* (2013.01); *H03M 13/015* (2013.01); *H03M 13/1111* (2013.01); *H03M 13/43* (2013.01); *H03M 13/45* (2013.01)

(58) Field of Classification Search
USPC ........................................ 714/794, 795, 797
See application file for complete search history.

(56) References Cited

U.S. PATENT DOCUMENTS

| | | | |
|---|---|---|---|
| 9,021,332 B2 | 4/2015 | Haratsch et al. | |
| 9,189,333 B2 | 11/2015 | Wu et al. | |
| 9,239,754 B2 | 1/2016 | Wu et al. | |
| 9,293,210 B2 | 3/2016 | Jang et al. | |
| 9,502,137 B2 | 11/2016 | Yoon et al. | |
| 2010/0169741 A1* | 7/2010 | Laurent | G06F 11/1068 714/763 |
| 2015/0242268 A1 | 8/2015 | Wu et al. | |
| 2017/0294217 A1* | 10/2017 | Lin | G06F 11/1068 |
| 2018/0010663 A1* | 1/2018 | Gandhi | F16F 7/12 |
| 2018/0293029 A1* | 10/2018 | Achtenberg | G11C 7/04 |

OTHER PUBLICATIONS

G. Dong, N. Xie and T. Zhang, "Enabling NAND Flash Memory Use Soft-Decision Error Correction Codes at Minimal Read Latency Overhead," in IEEE Transactions on Circuits and Systems I:Regular Papers, vol. 60, No. 9, pp. 2412-2421, Sep. 2013, DOI: 10.1109/TCSI.2013.2244361.

C. A. Aslam, Y. L. Guan and K. Cai, "Read and Write Voltage Signal Optimization for Multi-Level-Cell (MLC) NAND Flash Memory," in IEEE Transactions on Communications; vol. 64, No. 4, pp. 1613-1623, Apr. 2016, DOI: 10.1109/TCOMM.2016.2533498.

Dynamic Memory Error Model Estimation for Read and ECC Adaptations, andisk/Western Digital, by Eran Sharon, Alex Bazarsky, in Non-Volatile Memories Workshop, Mar. 12-14 2017, held at University of California, San Diego—Price Center Ballroom East Additional References sheet(s) attached.

* cited by examiner

DYNAMIC DETECTION FOR FLASH MEMORY

FIELD

Embodiments described herein relate generally to methods and devices for decoding data stored in non-volatile memory and particularly to ways of determining a log likelihood ratio for soft decoding of such data.

BACKGROUND

Memory cells in NAND flash memory cells consist of field effect transistors that comprise a floating gate interposed between the gate and the channel. NAND flash memory cells are organised into multiple blocks. Memory cells within each block are arranged horizontally along word-lines (for example around 32-64 word lines per block) that connect the gates of horizontally adjacent FETs, and vertically along (often thousands of) bit-lines, connecting drains and sources of vertically adjacent FETs. The control gates of all the cells along a word-line are connected to the address bus while the drains of the cells along a bit-line are connected the data bus. The unit for read/write operations is the word-line, whereas erasure is applied block-wise. Data may be programmed in logical units of a fixed size. Such logical units are sometimes referred to as pages. One or a plurality of pages of data may be stored along a single word-line.

To determine the storage state of a memory cell a bias voltage is applied to the wordline connected to the memory cell and a separate bias voltage is applied across the memory cell's channel. The gate voltage applied to all other memory cells that are connected to the memory cells that are to be read is such that the other memory cells are fully conducting so that the bias voltage applied along the bit-line is applied, to the large largest extent possible, across the channel of the memory cell to be read.

The conductivity of the channel of the memory cell to be read is supposed to be influenced solely by the amount of charge stored on the memory cell's floating gate and by the bias voltage applied to the gate of the memory cell. The source-drain current that can be sensed as flowing through the channel of/along the bit line connected to the memory cell allows concluding whether the amount of charge stored by the memory cell is above or below an amount required for rendering the channel of the memory cell conductive for a given gate bias voltage.

The stored charges in the floating gate of a memory cell charges are progressively injected into the floating gate using incremental step pulse program (ISPP). The amount of charge stored on the floating gate is monitored (for example using the above discussed sensing technique) to keep track of programming progress. Once it is determined that a charge that is sufficient to render the memory cell conductive for a given threshold voltage has been stored in a floating gate of the memory cell programming is completed.

It is worth noting that programming is a one-way process in a sense that the amount of charge stored on the floating gate cannot selectively be reduced. Instead, once the amount of charge stored in a memory cell exceeds a desired amount all of the charges on the memory cell need to be removed from the floating gate and programming re-started. Such erasure takes place simultaneously for all memory cells in a block of flash memory.

NAND flash memory cells are subject to various types of impairments that affect its performance, such as inaccurate programming, retention noise, random telegraph noise and more importantly inter-cell interference (ICI). It will be appreciated that charges stored on the floating gate generate electric fields that can influence the conductivity of the channel of an adjacent memory cell, thereby interfering with and potentially falsifying perceived memory cell storage state, as illustrated in FIG. 2. As flash memory architectures continue to be miniaturised the effect electric fields have on adjacent cells becomes more pronounced, thereby increasing ICI.

One way of mitigating the increasing ICI effect is to employ soft-decision error correction codes. Towards this purpose, a flash memory controller may start by comparing the threshold voltage against the hard decision boundaries, and upon failure of hard-decision decoding the controller will resort to generating soft information (e.g., LLRs) to be fed to the iterative decoder. However, as the channel model is not precisely known, it is desirable to have a simple and dynamic LLR estimation algorithm instead of relying on precomputed lookup table that may undermine the performance of the soft detection method.

In the following, embodiments will be described with reference to the drawings in which.

DETAILED DESCRIPTION

Figure 1:
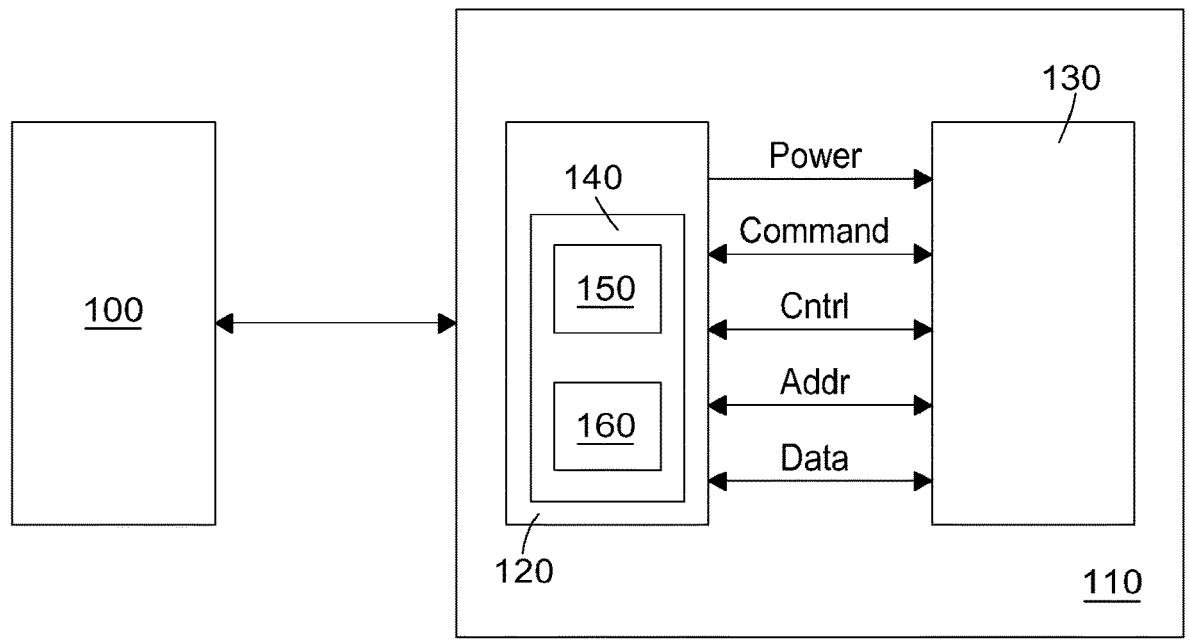
FIG. 1 shows a system that comprises a computing device and a non-volatile Flash storage memory.

According to an embodiment there is provided a method of decoding data stored in non-volatile memory, wherein each memory cell stores data by adopting one of a plurality of storage states. The method comprises using a threshold for determining a physical property of said memory cells to distinguish between at least two storage states, reading a data codeword from a plurality of the memory cells using said threshold and determining a bit error rate for the data codeword read using the threshold, repeatedly modifying said threshold and re-reading said data codeword using said modified threshold and determining a modified bit error rate for the data codeword read using the modified threshold, selecting the one of the modified thresholds for which the mutual information content between the stored data input and the read data is maximised based on the bit error rate for the data codeword read using the threshold and the bit error rate for the data codeword read using the modified threshold, determining a log likelihood ratio of a quantisation interval bounded by the said threshold and the selected threshold, generating soft decoded data by performing soft decoding of the data using said log likelihood ratio and outputting said soft decoding data.

Each of the modified thresholds may bound a quantisation interval. In an embodiment the method further comprises determining a hard bit estimate within the quantisation interval based on the bit error rate for the data codeword read using the threshold and the bit error rate for the data codeword read using the modified threshold.

The method may further comprise selecting a second threshold between the said selected threshold and the said threshold, repeatedly modifying said second threshold and re-reading said data codeword using said modified second threshold and determining a modified bit error rate for the data codeword read using the modified second threshold and selecting the one of the modified second thresholds for which the mutual information content between the stored data input and the read data is maximised based on the bit error rate for the data codeword read using the threshold and the bit error rate for the data codeword read using the modified threshold.

The selected modified second threshold and the said threshold may define a second quantisation interval. The method may further comprise determining a second hard bit estimate for the second quantisation interval and determining a hard bit estimate for a quantisation interval bounded by the selected modified threshold and the selected second modified threshold based on second hard bit estimate and the hard bit estimate.

The method may further comprise initially determining said threshold so as to minimise the determined bit error rate.

Said threshold can be an only threshold required to distinguish between the storage states the memory cell is capable of storing to read a stored bit or one of a plurality of thresholds required to distinguish between the storage states the memory cell is capable of storing to read a stored bit.

The method may further comprise optimising a threshold used for soft decoding for more than one or all of the plurality of thresholds.

According to another embodiment there is provided a non-volatile memory comprising program instructions for execution by a processor, the program instructions, when executed by the processor causing the processor to perform any of the aforementioned methods.

According to another embodiment there is provided a storage device comprising non-volatile memory and a memory controller for controlling the memory. The memory is configured to store data by adopting one of a plurality of storage states. The controller is configured to use a threshold for determining a physical property of memory cells in said memory to distinguish between at least two storage states, read a data codeword from a plurality of memory cells using said threshold and determine a bit error rate for the data codeword read using the threshold, repeatedly modify said threshold and re-reading said data codeword using said modified threshold and determine a modified bit error rate for the data codeword read using the modified threshold, select the one of the modified thresholds for which the mutual information content between the stored data input and the read data is maximised based on the bit error rate for the data codeword read using the threshold and the bit error rate for the data codeword read using the modified threshold, determine a log likelihood ratio of a quantisation interval bounded by the said threshold and the selected threshold, generate soft decoded data by performing soft decoding of the data using said log likelihood ratio and output said soft decoding data.

Error correction codes to which soft decoding can be applied include a LDPC (low-density parity check) code, a BCH code, a turbo code, an RS (Reed-Solomon code), a convolution code, an RSC (Recursive Systematic Code), or coded modulation such as TCM (Trellis-Coded Modulation), BCM (Block Coded Modulation), and so on. Soft deciding algorithms that can be used include, amongst others, mini-sum algorithms and Viterbi decoding. For soft decoders to work in the best possible way they require knowledge of the reliability of (e.g., log-likelihood ratios (LLRs)) of the read information to be fed to the iterative decoder. The incorporation of error correction codes to which soft decoding can be applied to replace legacy hard-decision ones can boost the reliability for flash memory beyond its current limits. Memory channels vary significantly depending on several factors (e.g., ambient temperature, program-erase cycles, retention time, among others) and the estimated soft metrics (i.e., the log-likelihood ratios) need to be updated accordingly to avoid performance degradation.

Firstly, the controller adapts the hard decision boundaries through minimizing the estimated BER. Upon failure of hard detection, the controller directly estimates the number of errors in each soft quantization bin and the soft values are fed to the decoder. The LLR values are estimated for the soft quantization bins in embodiments. However, if a finer soft quantization is needed finer reading intervals can be used and the method of embodiments be applied to such finer intervals.

FIG. 1 shows a system that comprises a computing device 100 and non-volatile Flash storage memory 110. The computing device may be a mobile computing device, such as a mobile phone, tablet computer, laptop, camera or any other type of mobile computing device. Alternatively the computing device 100 may be stationary, such as a desktop computer or indeed part of a stationary server or part of a storage bank, such as part of a RAID solution.

The non-volatile Flash storage memory 110 may take any form of non-volatile storage device comprising Flash memory. The non-volatile Flash storage memory 110 may, for example, be a "thumb drive", a solid-state drive (SSD), a memory card.

The computing device 100 and the non-volatile Flash storage memory 110 are in communicative connection with each other in a manner that allows the computing device 100 to transmit data and commands indicating the processing the data is to be subjected to by the non-volatile Flash storage memory 110 to the non-volatile Flash storage memory 110 and that allows the non-volatile Flash storage memory 110 return data retrieved from memory to the computing device 100. The computing device 100 may also provide power to the non-volatile Flash storage memory 110. A number of interfaces that allow communication between a computing device 100 and a non-volatile Flash storage memory 110 are known. The exact nature of the interface is not pertinent to the embodiments. Exemplary interfaces include the USB interface, SD, microSD, xD, CompactFlash, MMC, to name but a few.

The non-volatile Flash storage memory 110 comprises a memory controller 120 and non-volatile flash memory 130. The memory controller 120 interfaces with the computing device 100 as well as with the flash memory 130. The memory controller 120 provides power to the flash memory 130 and is moreover connected to the flash memory 130 wire command, control, address and data lines. The memory controller 120 may control all of the operations flash memory 130.

Figure 2:
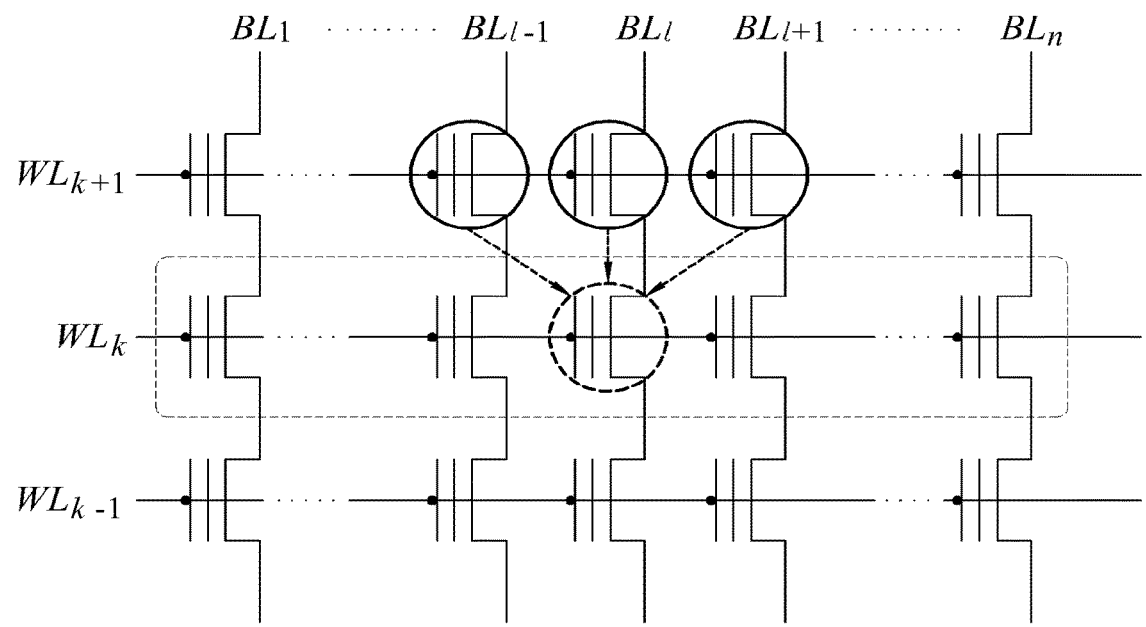
FIG. 2 shows an architecture of memory cells within a flash array.

As shown in FIG. 2, memory cells in NAND flash memory consist of field effect transistors that comprise a floating gate interposed between the FET's gate and channel. NAND flash memory cells are organised into multiple blocks. Memory cells within each block are arranged horizontally along word-lines (for example around 32-64 word lines per block; in FIG. 2 three word lines, $WL_{k+1}$, $WL_k$ and $WL_{k-1}$ are shown) that connect the gates of horizontally adjacent FETs, and vertically along (often thousands of) bit-lines ($BL_1$ to $BL_n$ in FIG. 2), connecting drains and sources of vertically adjacent FETs. The control gates of all the cells along a word-line are connected to the address bus while the drains of the cells along a bit-line are connected to the data bus. The unit for read/write operations is the word-line, whereas erasure is applied block-wise. A block comprises a number of word lines.

Figure 3:
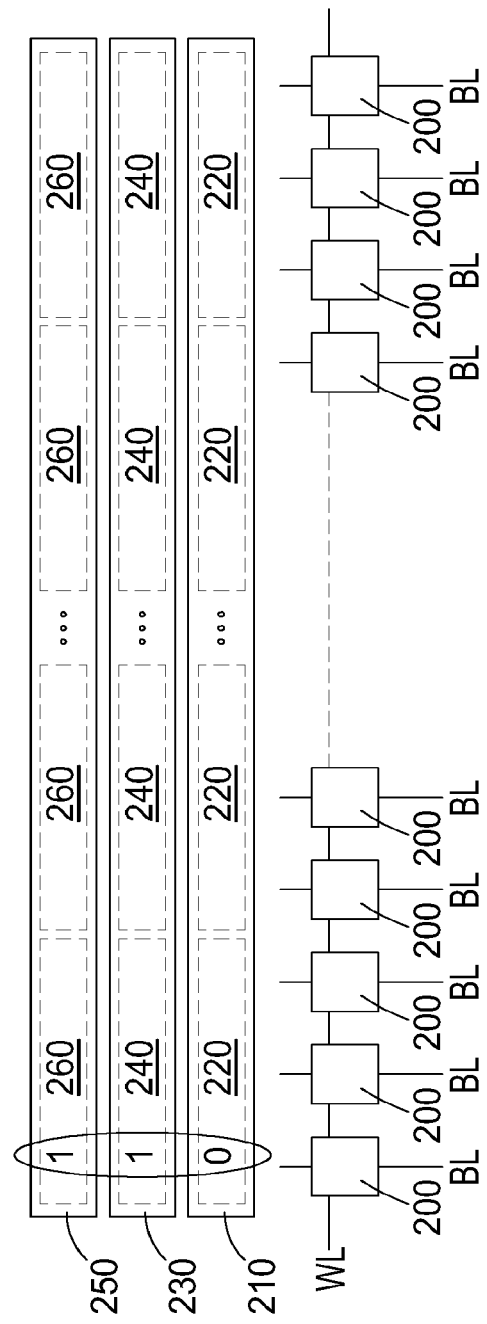
FIG. 3 illustrates a number of memory cells arranged along a word-line.

FIG. 3 illustrates a number of memory cells 200 arranged along a word-line (WL). Although only a few memory cells 200 are shown in FIG. 3, several thousand memory cells may be arranged along each word-line (WL). Several word-lines (WL) tend to be arranged so that their memory cells are connected (in FIG. 3 in the vertical direction) along bit lines BLs. In an embodiment all memory cells along a word line WL are programmed simultaneously. The data unit used for programming is illustrated in FIG. 3 by logical page 210. Each logical page may comprise smaller sub-units 220. The sub-units are referred to as codewords in embodiments described herein. More generally, however, a codeword is a string of data that has its own error correction codes associated with it. A sub-unit may, for example be 512 kByte in size to mimic the size of hard drive sectors and so that the flash memory can be addressed in the same manner as hard drives. The sub-units are referred to as pages in the following. Although FIG. 3 shows each page to be programmed into a group of consecutive memory cells 200 it is possible for data in pages to be programmed in every other cell or with more than one cell interleaved between the cells that contain the data of the page. The cells that are not programmed to comprise data of a particular page are programmed with data of one or more other pages, often in the same programming operation as the operation in which the page data is programmed.

For memory cells 200 that are to store only a single bit of data it is sufficient to adopt only one of two storage states. To operate memory cells to store more than one bit of data (memory cells for storing two bits of data are referred to as MLCs hereinafter while memory cells for storing three (resp. four) bits of data are referred to as TLCs (resp. QLCs) hereinafter) the program and read circuitry connected to the word and/or bit lines respectively are configured to distinguish between more than two storage states. To store two bits of data in a memory cell, for example, it is necessary to distinguish between four storage states (as shown in FIG. 4).

Data bits stored in each memory cell may be stored so that they are independent from each other. For example, data stored in a multi-bit memory cell may originate from different data pages, wherein a first page is programmed to a group of memory cells before a second or further pages are programmed to the group of memory cells. This is illustrated in FIG. 3. In a first programming pass a first set of pages 220 are programmed to the memory cells along word line WL. In the example shown in FIG. 3 the information stored in the left-most memory cell is a binary '0'. In a second programming pass a second set of pages 240 are programmed to the memory cells along word line WL. In the example shown in FIG. 3 the information stored in the left-most memory cell is a binary '10'. In a third programming pass a second set of pages 260 are programmed to the memory cells along word line WL. In the example shown in FIG. 3 the information stored in the left-most memory cell is a binary '110'.

To determine the storage state of a memory cell a bias voltage is applied to the word line connected to the memory cell in question and a separate bias voltage is applied across the memory cell's channel. The gate voltage applied to all other memory cells that are connected to the memory cells that is to be read is such that the other memory cells are fully conducting so that the bias voltage applied along the bit-line is applied, to the largest extent possible, across the channel of the memory cell to be read.

In the following it is assumed that the different memory logical pages (i.e., MSB page and LSB page for MLC flash memory) are encoded independently.

In the embodiment the memory controller starts with initial estimates of the hard boundaries (the boundaries used when writing) and checks the validity of the hard estimate of the stored codeword by evaluating its syndrome. If the syndrome has weight zero the codeword estimate is a legitimate codeword and decoding is successful. Otherwise, the estimated BER $\hat{p}_e$ in the i-th page is calculated according to:

$$\hat{p}_e = \frac{1 - \left(1 - \frac{2w(s)}{N_c}\right)^{1/d_c}}{2} \quad (1)$$

where w(s) denotes the weight of the syndrome s associated with the i-th page, $d_c$ denotes the check nodes degree (assuming a regular LDPC code is used) and $N_c$ denotes the number of parity check constraints.

The controller repeats the above procedure for varying hard boundaries until the number of estimated erroneous bits is minimized. Let the estimated hard boundaries that minimize (1) be denoted by $t_1^*, \ldots, t_{M-1}^*$, where M is the number of storage states supported by the cell. Upon failure of the hard detection (i.e., if the syndrome has a non-zero weight), the controller resorts to the more powerful soft detection.

Figure 4A:
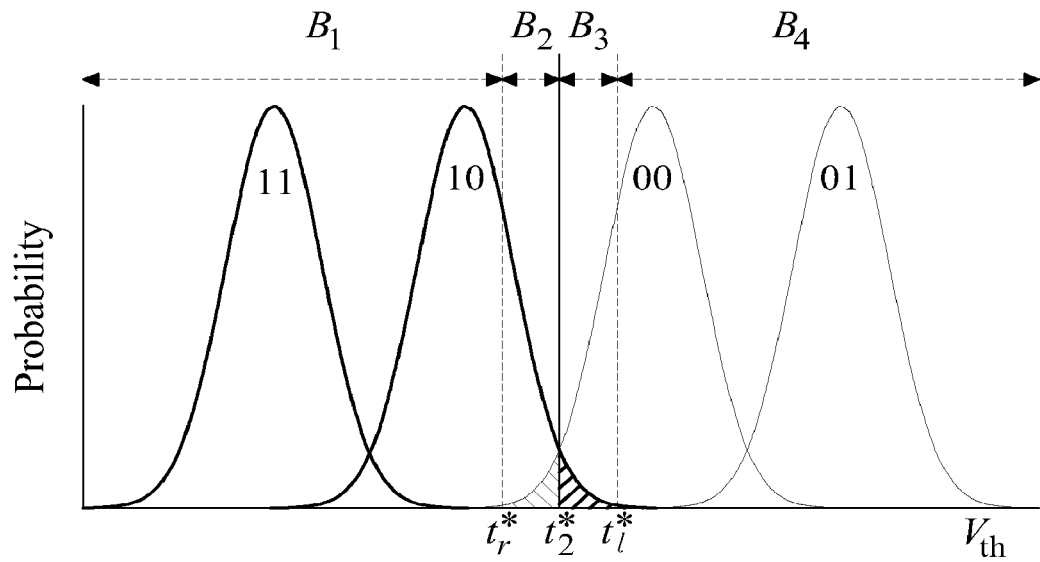
FIG. 4a shows storage state distributions in an MLC hard and soft decision boundaries and associated quantisation bins for reading the MSB.

It is well known that the optimal soft boundaries are non-uniformly distributed where more boundaries are required in the overlap region between adjacent threshold voltage levels. In an embodiment, each hard boundary is first surrounded with two soft boundaries as depicted in FIG. 4a (for the MSB) and FIG. 4b (for the LSB). The soft-decision boundaries are sought to be optimised through maximizing the mutual information between the binary input X and the quantized read voltage Y.

Figure 4B:
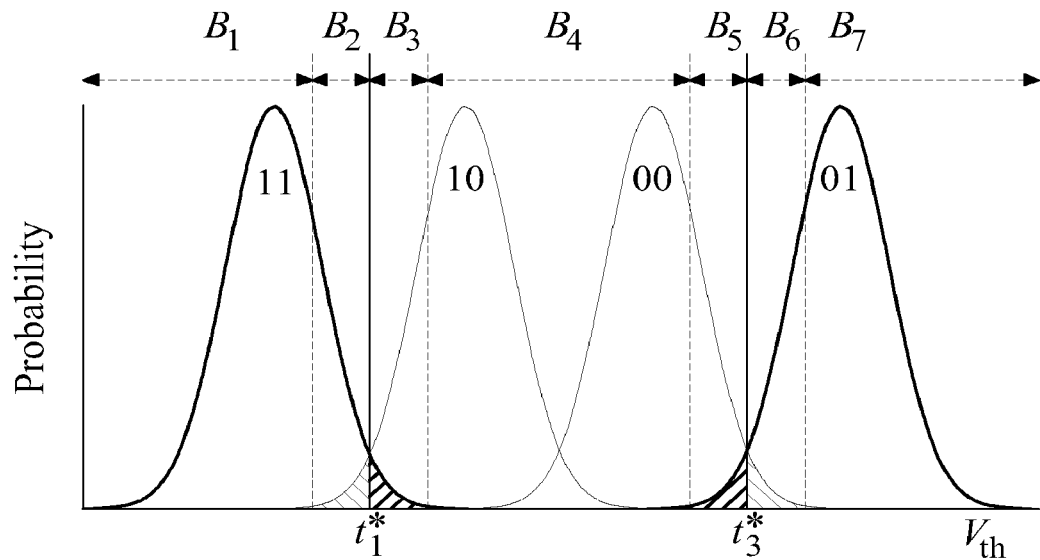
FIG. 4b shows storage state distributions in an MLC hard and soft decision boundaries and associated quantisation bins for reading the LSB.

As can be seen from FIGS. 4a and 4b, the overlap between the storage distributions in a 2-bit memory cell can lead to situations in which charges injected in the floating gate of a cell in an attempt to program it to a particular storage state, say to the "00" state to the right of the $t_2^*$ hard read boundary, cause the cell to conduct at a threshold voltage that is somewhat below the voltage $t_2^*$, i.e. for the example in which the cell was programmed to the "00" storage state the threshold voltage may be in the hatched area of the "00" storage state distribution that falls to the left of the $t_2^*$ threshold voltage. If this happens the storage state of the memory cell is incorrectly determined, in the example as storage state "10".

Figure 5:
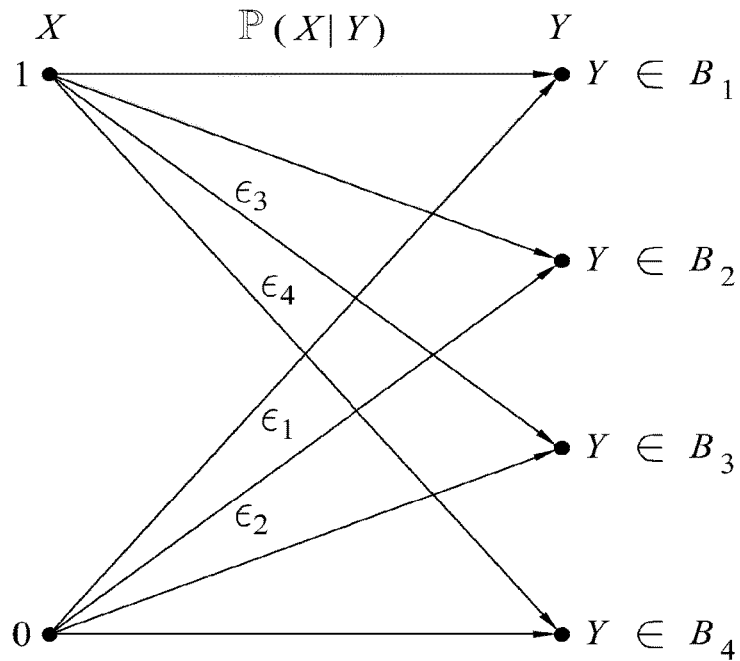
FIG. 5 illustrates possible errors in reading a SLC or the MSB of a MLC.

FIG. 5 shows the possible transitions for the MSB of a 2-bit memory cell between the programmed bit and the quantisation intervals/bins $\mathcal{B}_1$ to $\mathcal{B}_4$ shown in FIG. 4a. As will be appreciated, if a memory cell that is programmed to represent a logical "1" is detected to have a threshold voltage that falls within bin $\mathcal{B}_3$ or bin $\mathcal{B}_4$ then the detected programming state is incorrect. Equally if a memory cell that is programmed to represent a logical "0" is detected to have a threshold voltage that falls within bin $\mathcal{B}_1$ or bin $\mathcal{B}_2$ then the detected programming state is incorrect. The total number of errors within a codeword per bin and originating from the binary input X but being programmed to incorrect storage bins are indicated as $\epsilon_1$ to $\epsilon_4$ in FIG. 5. Arrows in FIG. 5 relating to correctly programmed storage states are not labelled.

The MSB page of MLC flash memory is modelled with three reads as a discrete memoryless channel (DMC) with binary input and quaternary output representing the quantized voltage reads as depicted in FIG. 5. The mutual information between the input and the quantized read voltage is expressed as $$I(X;Y) = H(X) - H(X|Y) \stackrel{(a)}{=} 1 - \sum_j h_b(\epsilon_j) \mathbb{P}(Y \in \mathcal{B}_j) \quad (2)$$

where $h_b(.)$ is the binary entropy function. In (a) we assumed that '0' and '1' are equally likely. In order to locate the left soft boundary $t_1^*$ shown in FIG. 4a, the controller compares the cells' threshold voltage against multiple references $\{t_2^* - i\delta: i=1, \ldots, L\}$ then evaluates the resulting syndromes and re-estimates the raw BER according to equation (1)(1) and obtains:

$$\epsilon_2 = \frac{1}{2} - \frac{N_v(\hat{p}_e - p_e^*)}{2n_2} \quad (3)$$

where $n_j$ denotes the number of cells that falls into $\mathcal{B}_j$, $\hat{p}_e$ denotes the estimated BER for the current reference voltage, $p_e^*$ denotes the estimated BER for reference voltage $t_2^*$ and $N_v$ denotes the codeword length. Recalling that the entropy $H(X)$ is a concave functional of $p(x)$, the mutual information in equation (2) can be lower bounded as:

$$I(X;Y) = 1 - h_b(\epsilon_2)\mathbb{P}(Y \in \mathcal{B}_2) - \sum_{j \neq 2} h_b(\epsilon_j)\mathbb{P}(Y \in \mathcal{B}_j) \quad (4)$$
$$\geq 1 - h_b(\epsilon_2)\mathbb{P}(Y \in \mathcal{B}_2) - h_b(\overline{\epsilon_2})\mathbb{P}(Y \notin \mathcal{B}_2)$$

where $p_e^* = \mathbb{P}(Y \in \mathcal{B}_2)\epsilon_2 + \mathbb{P}(Y \notin \mathcal{B}_2)\overline{\epsilon_2}$. The controller knows $\epsilon_2$ from equation (3) above as well as the number of cells in interval $\mathcal{B}_2$ and the overall error probability $p_e^*$. The memory controller can consequently calculate the right hand side of inequality (4) for a given soft boundary. By repeatedly reading the memory cells using different soft boundaries and using the results of these reads to calculate the right hand side of inequality (4) allows finding the soft boundary for which the right hand side of inequality (4) is maximised.

Similarly, by varying the reference voltage over $\{t_2^* + i\delta: i=1, \ldots, L\}$ the controller obtains:

$$\epsilon_3 = \frac{1}{2} - \frac{N_v(\hat{p}_e - p_e^*)}{2n_3} \quad (5)$$

$t_r^*$ is then found in the manner discussed above with reference to equation (4).

The LLR value associated with the j-th bin of the soft quantisation bins $\{\mathcal{B}_j: j=1, \ldots, n\}$ is defined as:

$$L_j \triangleq \log \frac{\mathbb{P}(b=0 | V_{th} \in \mathcal{B}_j)}{\mathbb{P}(b=1 | V_{th} \in \mathcal{B}_j)} \quad (6)$$

where $V_{th}$ is the threshold voltage. Equivalently, the above can be written as:

$$L_j = (-1)^{\hat{b}_j} \log\left(\frac{1-\epsilon_j}{\epsilon_j}\right) \quad (7)$$

where $\hat{b}_j$ (resp. $\epsilon_j$) denotes the hard bit estimate (resp. the bit-error rate) for the j-th soft bin.

The bits falling into the outermost regions (i.e., $\mathcal{B}_1$ and $\mathcal{B}_4$) are the most reliable and hence their LLR magnitude is set to a fixed high value.

When considering the LSB page, two hard-decision boundaries ($t_1^*$ and $t_3^*$ shown in 4b) need to be estimated compared to only one hard-decision boundary to estimate ($t_2^*$ shown in 4a) for the MSB case. Threshold voltages for these two hard decision boundaries are determined so as to minimise the number of errors in the LSB codeword. One approach is to start by estimating $t_1^*$ by sensing the cells with multiple reference voltages (typically close to the writing threshold) while fixing all other threshold voltages that influence the error rate of the bit that is to be read, in the case in which $t_1^*$ is read in the 2-bit example of FIG. 4b this is $\hat{t}_3$. For every voltage reference, the raw BER estimate can be obtained according to Equation (1), and the voltage reference resulting in the minimum estimated raw BER will be denoted $t_1^*$. The next step consists to repeating the same steps but while varying $\hat{t}_3$ and fixing $t_1^*$. At the end, $t_1^*$ and $t_3^*$ and the corresponding BER $p_e^*$ are available to the controller. The soft detection boundaries are determined in the same manner as described above with reference to FIG. 4a. The controller fixes $t_3^*$ and estimates $\epsilon_2^*$ and $\epsilon_3^*$. Next, the same steps are repeated but for fixed $t_1^*$ to obtain $\epsilon_5^*$ and $\epsilon_6^*$. The bits that fall into the remaining quantization bins are highly unlikely to be erroneously detected and hence are assigned a large LLR magnitude.

Generalisation to Denser Cells:

The aforementioned procedure is generalizable to cover denser cells such as triple-level cells (TLC) and quad-level cells (QLC). This is mainly due to the separate encoding/decoding of logical pages.

Higher Reading Precision

Figure 6:
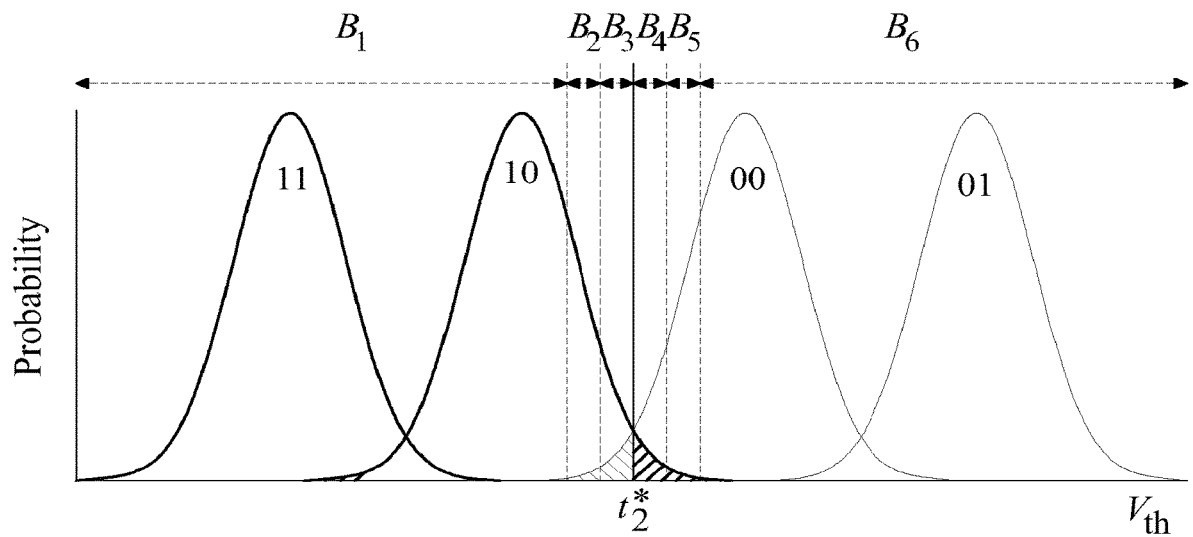
FIG. 6 shows additional quantisation bin being provided for higher precision soft decoding for the MSB of a MLC.

The memory controller may need to feed the LDPC iterative decoder with a higher-precision LLRs for the decoding to be successful. For that purpose, the soft quantization bins in the uncertainty region are further divided into finer ones (e.g., as in FIG. 6). Suppose that the quantization bins $\mathcal{B}_2 \cup \mathcal{B}_3$ and $\mathcal{B}_4 \cup \mathcal{B}_5$ have been estimated in the previous decoding round and that the objective is now to determine $\mathcal{B}_3$ and $\mathcal{B}_4$. The controller is configured to estimate the BER corresponding to $\mathcal{B}_3$ as shown in equation (3). As the total BER associated to $\mathcal{B}_2 \cup \mathcal{B}_3$ (say $\epsilon_{23}$) has been already inferred in the previous decoding attempt one has $$\epsilon_2 = \epsilon_{23}\left(1 + \frac{n_3}{n_2}\right) - \epsilon_3 \frac{n_3}{n_2} \quad (8)$$

$\epsilon_4, \epsilon_5$ are likewise determined and the blind maximization of the mutual information approach can be used to determine the soft decoding boundaries of $\mathcal{B}_3$ and $\mathcal{B}_4$ respectively.

Figure 7:
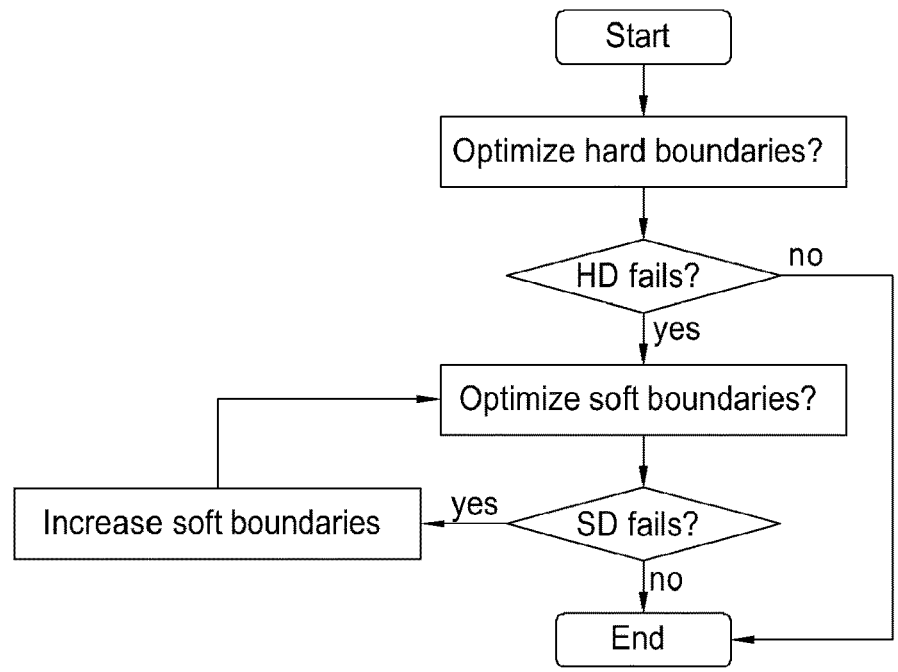
FIG. 7 shows a method according to an embodiment.

The flow chart of the detection algorithm of the embodiment is depicted in FIG. 7. It is worth noting that if no errors are detected and the BER is set to zero the resulting LLR would be very high. This would cause decoding failure. To avoid this, a cap is applied to the permitted LLR values and, should a calculated LLR value exceed this cap the LLR value is set to a maximum LLR value $LLR_{max}$ to account for estimation errors. Once soft-decoding is completed the decoded value may be output by the flash memory.

Known soft detection algorithms may assume that the memory channel is perfectly known to the controller. This is not practical because the memory channel depends on a plurality of factors that are not necessarily known to or quantified by the controller. This includes ambient temperature, the number of programme-erase cycles the memory cells have undergone, retention time and parasitic coupling, among others. The algorithm of the embodiments does not assume any prior channel knowledge, The approach of the embodiments provides an estimate of the LLRs associated with the soft bins. The estimation does not incure additional computational costs, only a few additional sensing operations are needed. Moreover, the proposed detection scheme can be applied repeatedly to yield finer quantization until decoding is successful.

Figure 8:
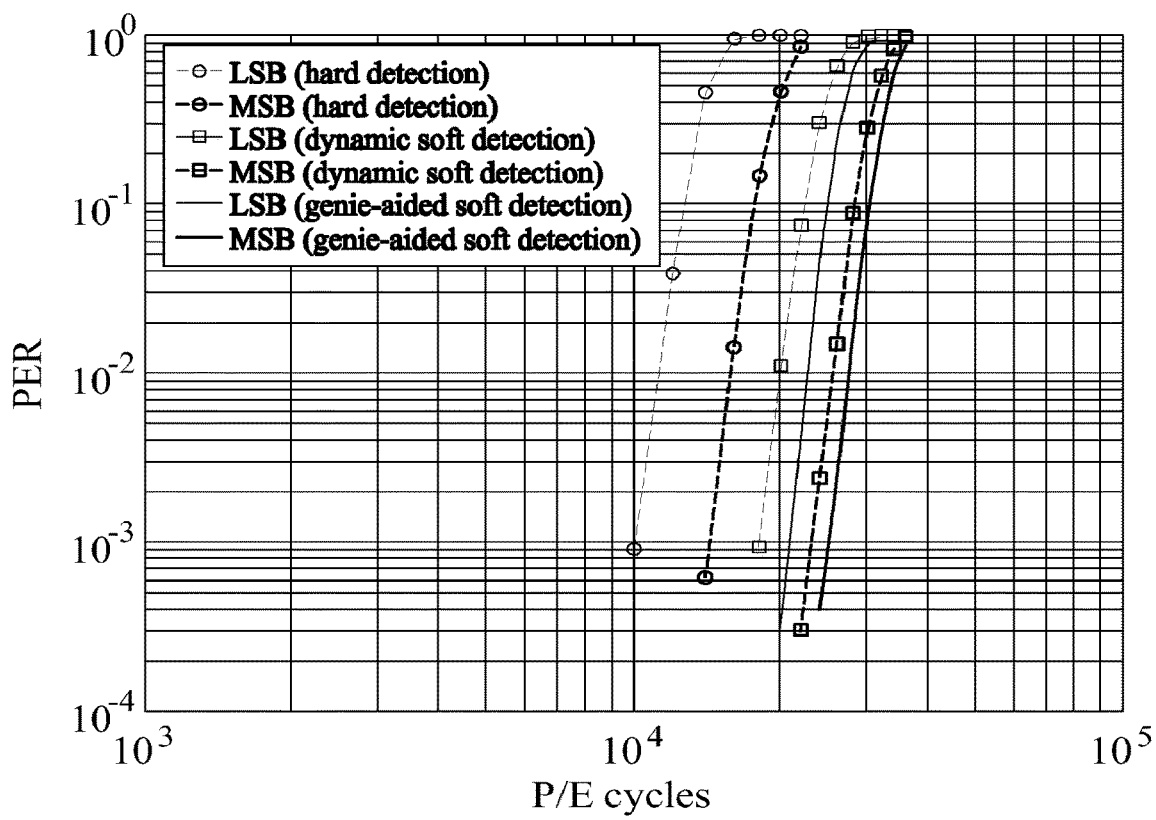
FIG. 8 shows illustrates the results of simulations of the performance of an embodiment.

The performance of embodiments has been evaluated using simulation. We compared the soft detection performance of the proposed scheme against simple hard detection and a genie-aided scheme. The hard detection scheme dynamically adapts the hard decision boundary and maps the detected bit to a predetermined LLR value (a binary "0" may, for example be mapped to a predetermined LLR value of "6" while a binary "1" may be mapped to a predetermined LLR value of "-6". These LLR values are provided to the LDPC iterative decoder to reconstruct the original data. The genie-aided scheme optimizes the hard/soft boundaries by maximizing the mutual information between the binary input and the quantized read voltage (J. Wang and et al., "Enhanced Precision Through Multiple Reads for LDPC Decoding in Flash Memories," *IEEE Journal on Selected Areas in Communications*, vol. 32, no. 5, pp. 880-891, 2014) and then counts the actual number of errors in every quantization bin which is then used to compute the actual LLR value according to Equation (7). The employed ECC is a (9216,8192) regular LDPC (randomly generated) with girth 6. As can be seen from FIG. 8, the proposed detector clearly outperforms the hard-decision based scheme and provides near-optimal performance. Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. A method of decoding data stored in non-volatile memory, wherein each memory cell stores data by adopting one of a plurality of storage states, the method comprising:
   using a threshold for determining a physical property of said memory cells to distinguish between at least two storage states;
   reading a data codeword from a plurality of the memory cells using said threshold and determining a bit error rate for the data codeword read using the threshold;
   repeatedly modifying said threshold and re-reading said data codeword using said modified threshold and determining a modified bit error rate for the data codeword read using the modified threshold;
   selecting one of modified thresholds for which mutual information content between the stored data input and the read data is maximised based on the bit error rate for the data codeword read using the threshold and the bit error rate for the data codeword read using the modified threshold;
   determining a log likelihood ratio of a quantisation interval bounded by the said threshold and the selected threshold;
   generating soft decoded data by performing soft decoding of the data using said log likelihood ratio; and
   outputting said soft decoding data.

2. The method of claim 1, wherein each of the modified thresholds bounds a quantisation interval, the method further comprising determining a hard bit estimate within the quantisation interval based on the bit error rate for the data codeword read using the threshold and the bit error rate for the data codeword read using the modified threshold.

3. The method of claim 2, further comprising:
   selecting a second threshold between the selected threshold and the threshold;
   repeatedly modifying said second threshold and re-reading said data codeword using said modified second threshold and determining a modified bit error rate for the data codeword read using the modified second threshold; and
   selecting the one of the modified second thresholds for which the mutual information content between the stored data input and the read data is maximised based on the bit error rate for the data codeword read using the threshold and the bit error rate for the data codeword read using the modified threshold.

4. The method of claim 3, wherein the selected modified second threshold and the said threshold define a second quantisation interval, the method further comprising determining a second hard bit estimate for the second quantisation interval and determining a hard bit estimate for a quantisation interval bounded by the selected modified threshold and the selected second modified threshold based on second hard bit estimate and the hard bit estimate.

5. The method of claim 1, further comprising initially determining said threshold so as to minimise the determined bit error rate.

6. The method of claim 1, wherein said threshold is an only threshold required to distinguish between the storage states the memory cell is capable of storing to read a stored bit.

7. The method of claim 1, wherein said threshold is one of a plurality of thresholds required to distinguish between the storage states the memory cell is capable of storing to read a stored bit.

8. The method of claim 7, further comprising optimising a threshold used for soft decoding for more than one or all of the plurality of thresholds.

9. A non-volatile memory comprising program instructions for execution by a processor, the program instructions, when executed by the processor causing the processor to perform the method of claim 1.

10. A storage device comprising:
a non-volatile memory configured to store data by adopting one of a plurality of storage states; and
a memory controller configured to:
use a threshold for determining a physical property of memory cells in said memory to distinguish between at least two storage states;
read a data codeword from a plurality of memory cells using said threshold and determine a bit error rate for the data codeword read using the threshold;
repeatedly modify said threshold and re-reading said data codeword using said modified threshold and determine a modified bit error rate for the data codeword read using the modified threshold;
select one of modified thresholds for which mutual information content between the stored data input and the read data is maximised based on the bit error rate for the data codeword read using the threshold and the bit error rate for the data codeword read using the modified threshold;
determine a log likelihood ratio of a quantisation interval bounded by the said threshold and the selected threshold;
generate soft decoded data by performing soft decoding of the data using said log likelihood ratio; and
output said soft decoding data.

11. The device of claim 10, wherein each of the modified thresholds bounds a quantisation interval, the controller further configured to determine a hard bit estimate within the quantisation interval based on the bit error rate for the data codeword read using the threshold and the bit error rate for the data codeword read using the modified threshold.

12. The device of claim 10, the controller further configured to:
select a second threshold between the selected threshold and the threshold;
repeatedly modify said second threshold and re-reading said data codeword using said modified second threshold and determine a modified bit error rate for the data codeword read using the modified second threshold; and
select the one of the modified second thresholds for which the mutual information content between the stored data input and the read data is maximised based on the bit error rate for the data codeword read using the threshold and the bit error rate for the data codeword read using the modified threshold.

13. The device of claim 12, wherein the selected modified second threshold and the said threshold define a second quantisation interval, the controller further configured to determine a second hard bit estimate for the second quantisation interval and determine a hard bit estimate for a quantisation interval bounded by the selected modified threshold and the selected second modified threshold based on second hard bit estimate and the hard bit estimate.

14. The device of claim 10, the controller further configured to initially determine said threshold so as to minimise the determined bit error rate.

15. The device of claim 10, wherein said threshold is an only threshold required to distinguish between the storage states the memory cell is capable of storing to read a stored bit.

16. The device of claim 10, wherein said threshold is one of a plurality of thresholds required to distinguish between the storage states the memory cell is capable of storing to read a stored bit.

17. The device of claim 16, the controller further configured to optimise a threshold used for soft decoding for more than one or all of the plurality of thresholds.

* * * * *